US010854596B2

(12) United States Patent
Gorbachov et al.

(10) Patent No.: US 10,854,596 B2
(45) Date of Patent: Dec. 1, 2020

(54) CMOS RF POWER LIMITER AND ESD PROTECTION CIRCUITS

(71) Applicant: BeRex Corporation, Seoul (KR)

(72) Inventors: Oleksandr Gorbachov, Irvine, CA (US); Lisette L. Zhang, Redondo Beach, CA (US); Stephen Milkovits, Garden Grove, CA (US)

(73) Assignee: BeRex, Inc., Santa Clara, CA (US)

( * ) Notice: Subject to any disclaimer, the term of this patent is extended or adjusted under 35 U.S.C. 154(b) by 0 days.

(21) Appl. No.: 16/699,499

(22) Filed: Nov. 29, 2019

(65) Prior Publication Data

US 2020/0176441 A1 Jun. 4, 2020

Related U.S. Application Data

(60) Provisional application No. 62/772,989, filed on Nov. 29, 2018.

(51) Int. Cl.
*H01L 27/02* (2006.01)
*H03F 1/26* (2006.01)
(Continued)

(52) U.S. Cl.
CPC .......... *H01L 27/0288* (2013.01); *H03F 1/26* (2013.01); *H03F 3/21* (2013.01); *H03G 11/006* (2013.01); *H04B 1/18* (2013.01)

(58) Field of Classification Search
CPC ... H03G 11/006; H04B 1/18; H02M 3/33523; H02M 3/335; H02H 3/20; H02H 1/00;
(Continued)

(56) References Cited

U.S. PATENT DOCUMENTS 4,617,482 A * 10/1986 Matsuda .......... H03K 19/00315
257/358
5,578,860 A * 11/1996 Costa .................. H01L 27/0251
257/362
(Continued)

OTHER PUBLICATIONS

Apostolos Samelis et al., Front-end Modules with Versatile Dynamic EVM Correction for 802.11 Application in the 2GHz Band, Skyworks Solutions Inc, Bishops Stortford, UK.
(Continued)

*Primary Examiner* — Thienvu V Tran
*Assistant Examiner* — Nusrat Quddus
(74) *Attorney, Agent, or Firm* — Eric Karich; Karich & Associates

(57) ABSTRACT

An RF power limiter and ESD protection circuit has a set of two CMOS FETs each configured to perform a diode function with a defined forward voltage and arranged in an anti-parallel configuration and coupled between the input terminal and the ground terminal. When an RF signal is applied symmetrically to the input terminal and ground terminal it becomes symmetrically attenuated when the signal level exceeds the defined forward voltage of the diode configured CMOS FETs. In the ESD protection mode one of the CMOS FETs acts as a grounded gate NMOS transistor with SCR action to provide for mitigation of voltage and current over-stress of transistors utilized in RF transceiver circuits. Generally, the circuit architectures allow input power levels to be limited to an extent that reliable operation can be maintained.

20 Claims, 11 Drawing Sheets

(51) Int. Cl.
*H03G 11/00* (2006.01)
*H04B 1/18* (2006.01)
*H03F 3/21* (2006.01)

(58) Field of Classification Search
CPC .. H02H 1/04; H02H 1/06; H02H 9/00; H02H 9/02; H02H 9/04; H02H 9/06; H02H 9/08; H02H 9/041; H02H 9/042; H02H 9/043; H02H 9/044; H02H 9/045; H02H 9/046; H02H 9/047; H03K 5/08; H03K 19/0948; H03K 17/08; H03K 17/0822; H03K 17/102; H03K 17/79; H03K 17/687; H01L 31/075; H01L 21/425; H01L 21/8324; H01L 24/00; H01L 24/06; H01L 23/62; H01L 23/66; H01L 2924/13062; H01L 29/808; H01L 29/1066; H01L 29/7392; H01L 29/098; H01L 29/1058; H01L 29/401; H01L 29/49; H01L 27/02; H01L 27/0288; H01L 27/085; H01L 27/14679; H01L 27/0248; H01L 27/0251; H01L 27/0255; H01L 27/0259; H01L 27/027; H01L 27/0274; H01L 27/0277; H01L 27/0281; H01L 27/0285; H01L 27/0292; H01L 27/0296; H01L 27/1207; H01L 27/0705; H03F 1/26; H03F 3/21

See application file for complete search history.

(56) References Cited

U.S. PATENT DOCUMENTS

| | | | | |
|---|---|---|---|---|
| 6,094,088 A * | 7/2000 | Yano | H03K 17/693 | 327/534 |
| 6,426,680 B1 * | 7/2002 | Duncan | H01F 17/0006 | 257/E27.046 |
| 6,445,039 B1 * | 9/2002 | Woo | H01F 17/0006 | 257/355 |
| 6,525,609 B1 * | 2/2003 | Behzad | H03L 1/023 | 330/254 |
| 6,936,895 B2 * | 8/2005 | Manna | H01L 29/868 | 257/355 |
| 6,985,035 B1 * | 1/2006 | Khorramabadi | H01F 17/0006 | 330/149 |
| 8,018,002 B2 * | 9/2011 | Salman | H01L 27/0802 | 257/360 |
| 8,207,781 B2 * | 6/2012 | Noh | H03K 17/693 | 327/436 |
| 8,232,827 B2 * | 7/2012 | Sagae | H03K 17/687 | 327/308 |
| 8,305,725 B2 * | 11/2012 | Ooi | H01M 2/1066 | 361/103 |
| 8,847,672 B2 * | 9/2014 | Prabhakar, III | H01L 27/0629 | 327/537 |
| 8,928,388 B2 * | 1/2015 | Lu | H03G 7/06 | 327/312 |
| 9,087,719 B2 * | 7/2015 | Ahsan | H01L 29/7835 | |
| 9,520,251 B2 * | 12/2016 | Keane | H03K 17/693 | |
| 9,667,242 B2 * | 5/2017 | Saito | H01L 29/7835 | |
| 9,673,187 B2 * | 6/2017 | Salcedo | H01L 27/0207 | |
| 9,711,659 B2 * | 7/2017 | Karino | H01L 29/808 | |
| 9,978,743 B1 * | 5/2018 | Loiseau | H03K 19/00315 | |
| 10,008,490 B2 * | 6/2018 | Salcedo | H01L 27/0262 | |
| 10,587,114 B2 * | 3/2020 | Kanawati | H01L 27/0274 | |
| 10,622,993 B2 * | 4/2020 | Burgener | H01P 1/15 | |
| 2005/0017688 A1 * | 1/2005 | Stellberger | H02J 7/0029 | 320/134 |
| 2005/0151160 A1 * | 7/2005 | Salcedo | H01L 29/7436 | 257/173 |
| 2006/0131654 A1 * | 6/2006 | Poulton | H01L 29/861 | 257/355 |
| 2006/0132996 A1 * | 6/2006 | Poulton | H01L 27/0255 | 361/56 |
| 2011/0187475 A1 * | 8/2011 | Kim | H01P 1/15 | 333/103 |
| 2012/0068757 A1 * | 3/2012 | Seshita | H03K 17/693 | 327/427 |
| 2013/0026550 A1 * | 1/2013 | Yoshioka | H01L 29/0619 | 257/296 |

OTHER PUBLICATIONS

Yichi Zhang, Evaluation of Envelope-Domain Dynamic X-Parameter Model Based on Variable-Carrier-Frequency Anaylsis, School of Electronics Info Eng, Harbin Inst. of Tech, 2012.

T. Sadeghpour, Compensation of Transmission non-linearity Distortion with Memory Effect for a WLAN802.11a Transmitter, IET Science, Measurement and Technology, Oct. 26, 2011.

Patrick Roblin, New Trends for the Nonlinear Measurement and Modeling of High-Power RF Transistors and Amplifiers With Memory Effects, IEEE Trans . . vol. 60 No. 6, Jun. 6, 2012.

Yitao Zhang, A Simple Envelope Model for Nonlinear Power Amplifiers with Memory Effects Based on Volterra Expansion, Grad Sch of Science & Eng, Tokyo Inst of Tech, Conf 2010.

Hyunchul KU, Behavioral Modeling of Nonlinear RF Power Amplifiers Considering Memory Effect, IEEE Transactions of Microwave Theory and Tec, vol. 51 No. 12, Dec. 2003.

Angela McConnell, Thermal Conductivity of Doped Polysilicon Layers, Journal of Microeletromechanical systems, vol. 10 No. 3, Sep. 2001.

* cited by examiner

CMOS RF POWER LIMITER AND ESD PROTECTION CIRCUITS

CROSS-REFERENCE TO RELATED APPLICATIONS

This application for a utility patent claims the benefit of U.S. Provisional Application No. 62/772,989, filed Nov. 29, 2018.

BACKGROUND OF THE INVENTION

Field of the Invention

This invention relates generally to radio frequency (RF) power limiting and electrostatic discharge (ESD) circuitry, and more particularly to transceiver architectures with input power protection circuits used, for example, in mobile communications systems.

Description of Related Art

Wireless communications systems find applications in numerous contexts involving information transfer over long and short distances alike, and there exists a wide range of modalities suited to meet the particular needs of each. Chief amongst these systems with respect to popularity and deployment is the mobile or cellular phone.

A fundamental component of any wireless communications system is the transceiver, that is, the combined transmitter and receiver circuitry. The transceiver encodes the data to a baseband signal and modulates it with an RF carrier signal. Upon receipt, the transceiver down-converts the RF signal, demodulates the baseband signal, and decodes the data represented by the baseband signal. An antenna connected to the transmitter converts the electrical signals to electromagnetic waves, and an antenna connected to the receiver converts the electromagnetic waves back to electrical signals. Depending on the particulars of the communications modality, single or multiple antennas may be utilized.

Conventional transceivers typically do not generate sufficient power or have sufficient sensitivity for reliable communications standing alone. Thus, additional conditioning of the RF signal is necessary. The circuitry between the transceiver and the antenna that provides this functionality is referred to as the front end circuit, which is understood to be comprised of a power amplifier for increased transmission power, and/or a low noise amplifier for increased reception sensitivity. Each band or operating frequency of the communications system may have a dedicated power amplifier and low noise amplifier tuned specifically to that operating frequency.

For a typical power amplifier utilized in WiFi applications, the gain requirement in the transmit mode is in the range of 25 dB to 30 dB. WiFi generally refers to multiple generations of local area networking standards designated as IEEE 802.11, each with different operating parameters. For instance, the maximum linear output power is approximately 18 dBm to 22 dBm in the 802.11g mode with an operating frequency of 2.5 GHz. The maximum linear output power in the 802.11a mode with an operating frequency of 5 GHz may be 17 dBm to 21 dBm. In light of these amplifier gain parameters and output power requirements, the transceiver output power is typically no more than −3 dBm. However, in a calibration mode, the WiFi transceiver may increase the output power to as high as 10 dBm. The long-term reliability of the power amplifier may be compromised at these input power levels to the power amplifier, as there may be excessive voltage stress on the transistors thereof. The transistors in the last stages of the transmit chain are subject to the highest voltage stresses, as the previous stages amplify the input signal to levels high enough to cause damage. This is particularly problematic in CMOS (complementary metal oxide semiconductor) transistors that have lower breakdown voltage ratings compared to conventional BiCMOS or GaAs (gallium arsenide) technologies.

The transistors in the last amplifier stage are subject to additional stresses beyond that which is associated with the large input signal alone when the output is not perfectly matched to the 50 Ohm load. This may often be the case when the transceiver/front end circuitry is connected to automatic test equipment in a production line. This may result in the voltage level at the transistor terminals far exceeding that for reliable operation. Accordingly, there is a need in the art for improved architectures for limiting input power and for protecting power amplifiers from input power overstress. The present invention fulfills these needs and provides further advantages as described in the following summary.

SUMMARY OF THE INVENTION

The present invention teaches certain benefits in construction and use which give rise to the objectives described below.

A primary objective of the present invention is to provide an RF power limiter circuit having advantages not taught by the prior art. For example, according to one embodiment, a power limiter comprises a set of two CMOS FETs each configured to perform a diode function with a defined forward voltage, and arranged in an anti-parallel configuration and coupled between the input terminal and the ground terminal. When an RF signal is applied symmetrically to the input terminal and ground terminal it becomes symmetrically attenuated when the signal level exceeds the defined forward voltage of the diode configured CMOS FETs.

An additional objective of the present invention is to provide for mitigation of voltage and current over-stress of transistors utilized in RF transceiver circuits. Generally, the circuit architectures allow input power levels to be limited to an extent that reliable operation can be maintained.

Additionally, the proposed solutions consume much smaller area compared to prior art solutions, they do not require a bias current or voltage be applied, and they do not require additional matching circuitry. Finally, the proposed solutions may be integrated into transceiver circuits that are fabricated in CMOS technology or applied as standalone devices.

Other features and advantages of the present invention will become apparent from the following more detailed description, taken in conjunction with the accompanying drawings, which illustrate, by way of example, the principles of the invention.

BRIEF DESCRIPTION OF THE DRAWINGS

The accompanying drawings illustrate the present invention. In such drawings.

DETAILED DESCRIPTION OF THE INVENTION

Figures 1A, 1B:
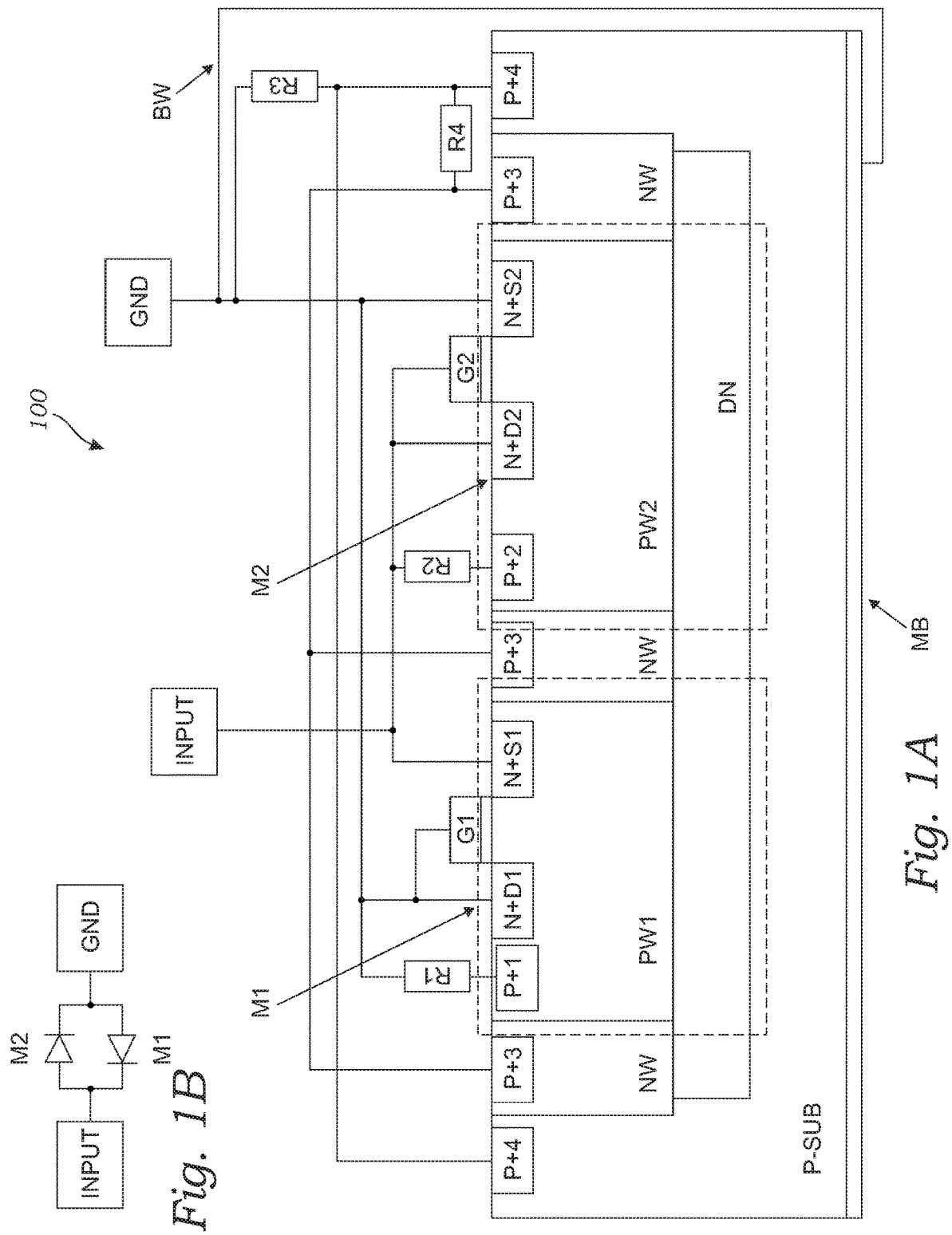
FIG. 1A illustrates a cross section diagram of a CMOS technology implementation of an RF power limiting circuit in accordance with one embodiment of the invention.
FIG. 1B is a schematic depiction of two NMOS transistors configured as diode-connected transistors and arranged in an anti-parallel configuration.

Various embodiments of a CMOS integrated circuit with RF power limiting and ESD protection capabilities are described herein. In the following description, numerous specific details are set forth in order to provide a thorough understanding of the present invention. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects. A substrate may have a front side and a back side. Any fabrication process that is performed from the front side may be referred to as a frontside process while any fabrication process that is performed from the back side may be referred to as a backside process. Structures and devices such as diodes, resistors and associated transistors may be formed in a front surface of a substrate. A dielectric stack that includes alternating layers of metal routing layers and is conductive via layers may be formed on the front surface of a substrate.

Throughout the specification and claims, the following terms take the meanings explicitly associated herein, unless the context clearly dictates otherwise. The terms "coupled" and "connected", which are utilized herein, are defined as follows. The term "connected" is used to describe a direct connection between two circuit elements, for example, by way of a metal line formed in accordance with normal integrated circuit fabrication techniques. In contrast, the term "coupled" is used to describe either a direct connection or an indirect connection between two circuit elements. For example, two coupled elements may be directly coupled by way of a metal line, or indirectly connected by way of an intervening circuit element (e.g., a capacitor, resistor, or by way of the source/drain terminals of a transistor). The term "circuit" means either a single component or a multiplicity of components, either active or passive, that are coupled together to provide a desired function. The term "signal" means at least one current, voltage, or data signal. Although circuit elements may be fabricated on the back side, when reference is made to certain circuit elements residing within or formed in a substrate, this is generally accepted to mean the circuits reside on the front side of the substrate.

The above-described drawing figures illustrate the invention, a CMOS integrated circuit with RF power limiting and ESD protection capabilities. Commonly known RF power limiters are typically based on PIN diode structures or Schottky diode structures which require specialized and costly Silicon-based or Gallium Arsenide fabrication technologies in order to be physically implemented. Also in the prior art are RF power limiter circuit solutions which require the addition of inductor structures which occupy large areas of the semiconductor substrate or may require multiple substrates and assembly into a separate and costly module. Other RF power limiter circuits have been implemented with Micro Electrical Mechanical Systems (MEMS) structures or with Silicon on Insulator (SOI) technologies, all of which add cost compared to standard CMOS or BiCMOS fabrication technologies.

FIG. 1A illustrates a cross section diagram of a low cost CMOS technology implementation of an RF power limiting circuit 100 in accordance with an embodiment of the invention. The circuit 100 is based on two NMOS FET transistors, M1 and M2, both isolated from a P-type Silicon substrate P-SUB by a deep N-well DN of a commonly known triple well CMOS process technology. The two NMOS FET transistors M1 and M2 are formed on a front surface of substrate P-SUB in first and second P-well regions PW1 and PW2 respectively. Each P-well region is surrounded by N-well regions NW while deep N-well DN spans the region beneath N-well regions NW and P-well regions PW1 and PW2.

FIG. 1B is a schematic depiction of the two NMOS transistors configured as diode-connected transistors and arranged in an anti-parallel configuration between an input terminal INPUT of the RF power limiter circuit and a ground terminal GND. As further illustrated in FIG. 1A, a first resistor R1 is connected between ground terminal GND and highly P-type doped region P+1 which forms an Ohmic contact to first P-well PW1. A second resistor R2 is connected between input terminal INPUT and highly P-type doped region P+2 which forms an Ohmic contact to second P-well PW2. A first shunt wire connects ground terminal GND and the gate electrode G1 and the drain terminal N+D1 of first NMOS FET M1. A second shunt wire connects input terminal INPUT and the gate electrode G2 and the drain terminal N+D2 of second NMOS FET M2. A third shunt wire connects ground terminal GND and the source terminal N+S2 of second NMOS FET M2 and a fourth shunt wire connects input terminal INPUT to the source terminal N+S1 of first NMOS FET M1.

FIG. 1A also illustrates components and connections surrounding and supporting NMOS FET transistors M1 and M2 that contribute to the stable and reliable operation of the invented RF power limiter circuit 100. Those components and connections comprise a bond wire BW connecting ground terminal GND to a metallized back surface MB of P-type Silicon substrate P-SUB wherein bond wire BW may contribute an inductance to the RF power limiter circuit 100 design. In addition, those components and connections comprise a third resistor R3 connected between ground terminal GND and one or more highly P-type doped regions P+4 which form Ohmic contacts to P-type Silicon substrate P-SUB. Finally, those components and connections comprise a fourth resistor R4 connected between highly P-type doped regions P+4 and one or more highly P-type doped regions P+3 which, as illustrated, are formed in the N-well regions NW. By these constructions, deep N-well DN is diode isolated from P-wells PW1 and PW2 as well as from P-type Silicon substrate P-SUB, ground terminal GND, and input terminal INPUT.

Embodiments of the invention as illustrated in FIG. 1A may be fabricated in a 0.18 micron CMOS fabrication technology and may have Silicon substrate thicknesses of 3 microns to 200 microns. The Silicon substrate may comprise a P-type Silicon epitaxial layer grown over a P-type Silicon substrate. The NMOS FETs may be fabricated with gate electrode widths between 5 microns and 30 microns. The invented circuit 100 may provide a power limiting level starting at +14 dBm and may limit RF signals as fast as 5 GHz. First and second resistors R1 and R2 may have values between 1 kOhm and 100 kOhm. Third and fourth resistors R3 and R4 may have values between 1 kOhm and 100 kOhm. In another embodiment not illustrated herein, regions P+3 may be connected to a regulated positive voltage power supply in order to maintain a positive bias on deep N-well DN relative to substrate P-SUB.

Figure 2:
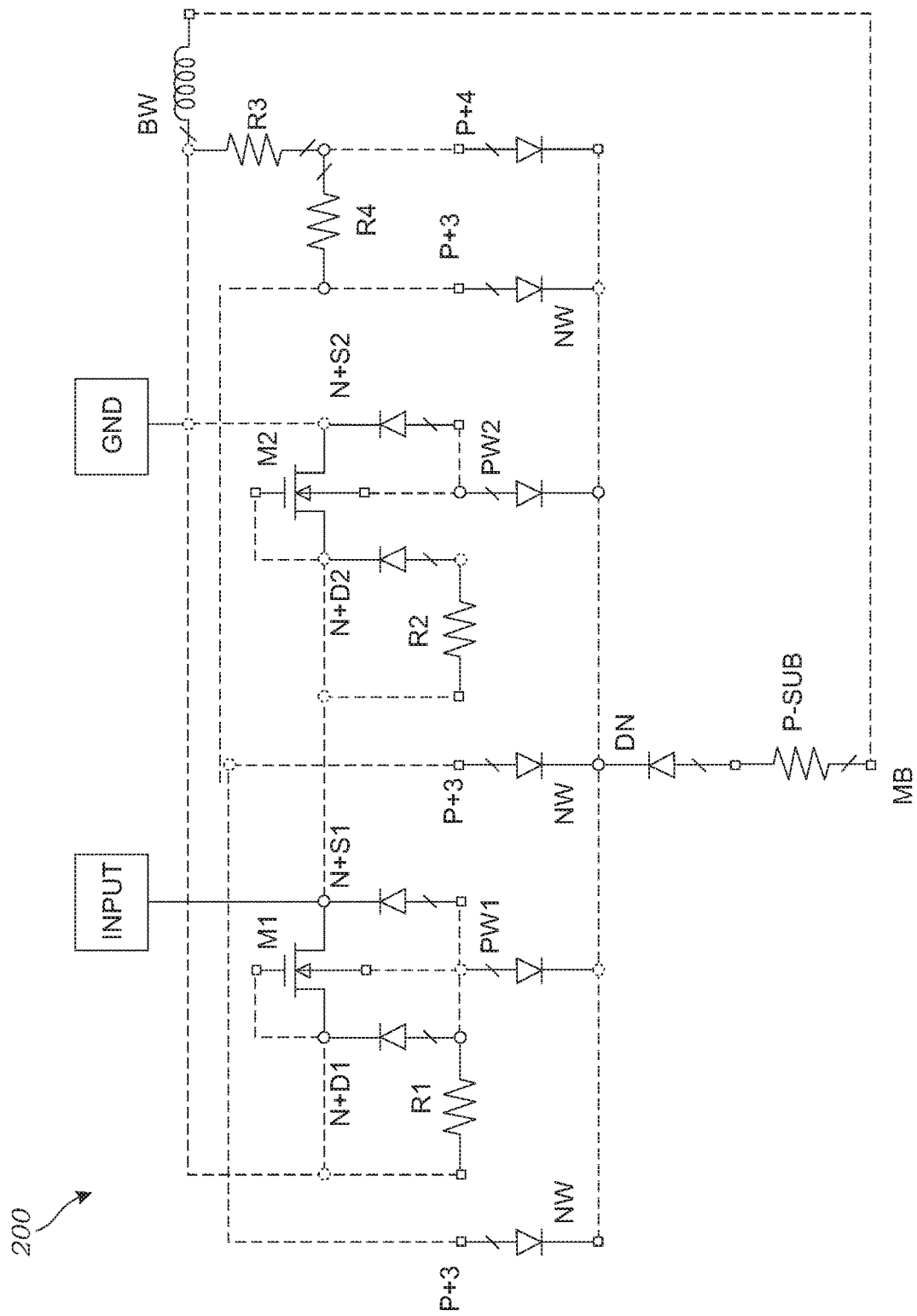
FIG. 2 is an electrical schematic diagram representing an equivalent circuit of the RF power limiter circuit structures shown in FIG. 1A.

FIG. 2 is an electrical schematic diagram representing an equivalent circuit 200 of the RF power limiter circuit structures shown in FIG. 1A. The circuit node labels shown in FIG. 2 correspond to like-named structure elements in FIG. 1A. NMOS FETs M1 and M2 are shown to be in a diode-connected arrangement due to their gate electrodes and drain electrodes being tied together.

Figure 3:
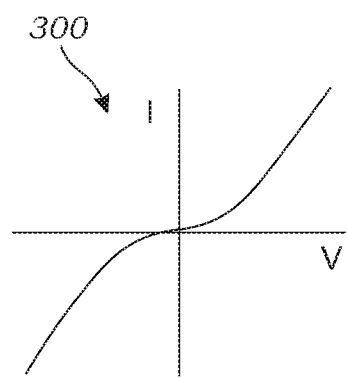
FIG. 3 illustrates the joint characteristics of an anti-parallel connection of two diodes which is the net characteristic of the embodiment of the invention shown in FIG. 1A.

FIG. 3 illustrates the related I-V characteristics when an RF signal is applied between terminals INPUT and GND. The current (I) versus voltage (V) plot 300 shown in FIG. 3 illustrates the joint characteristics of an anti-parallel connection of two diodes, which is the net characteristic of the embodiment of the invention shown in FIG. 1A.

Figure 4:
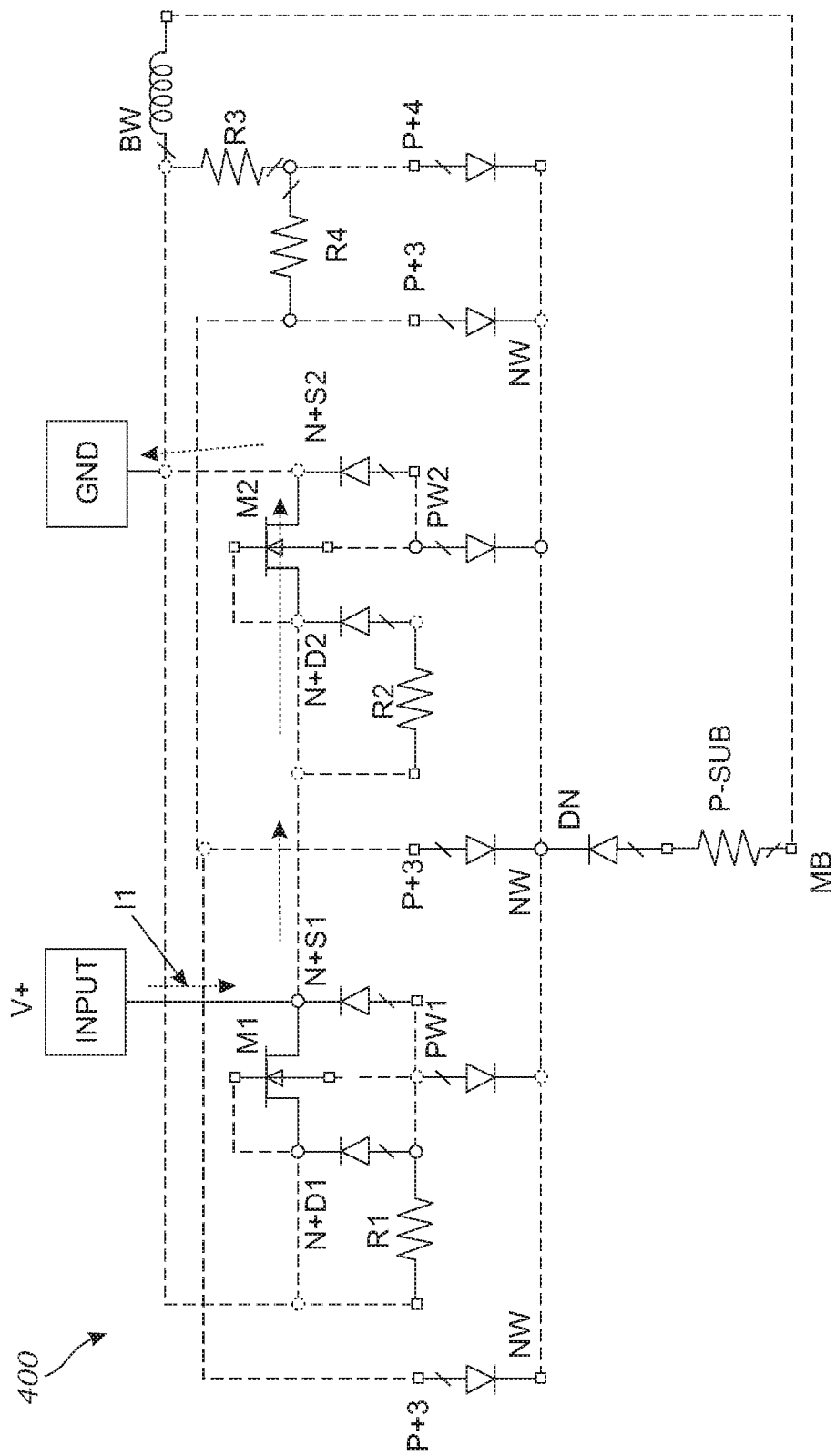
FIG. 4 is an illustration of the RF limiter circuit current paths associated with a positive voltage V+ being applied to the input terminal of the electrical schematic diagram illustrated in FIG. 2.
Figure 5:
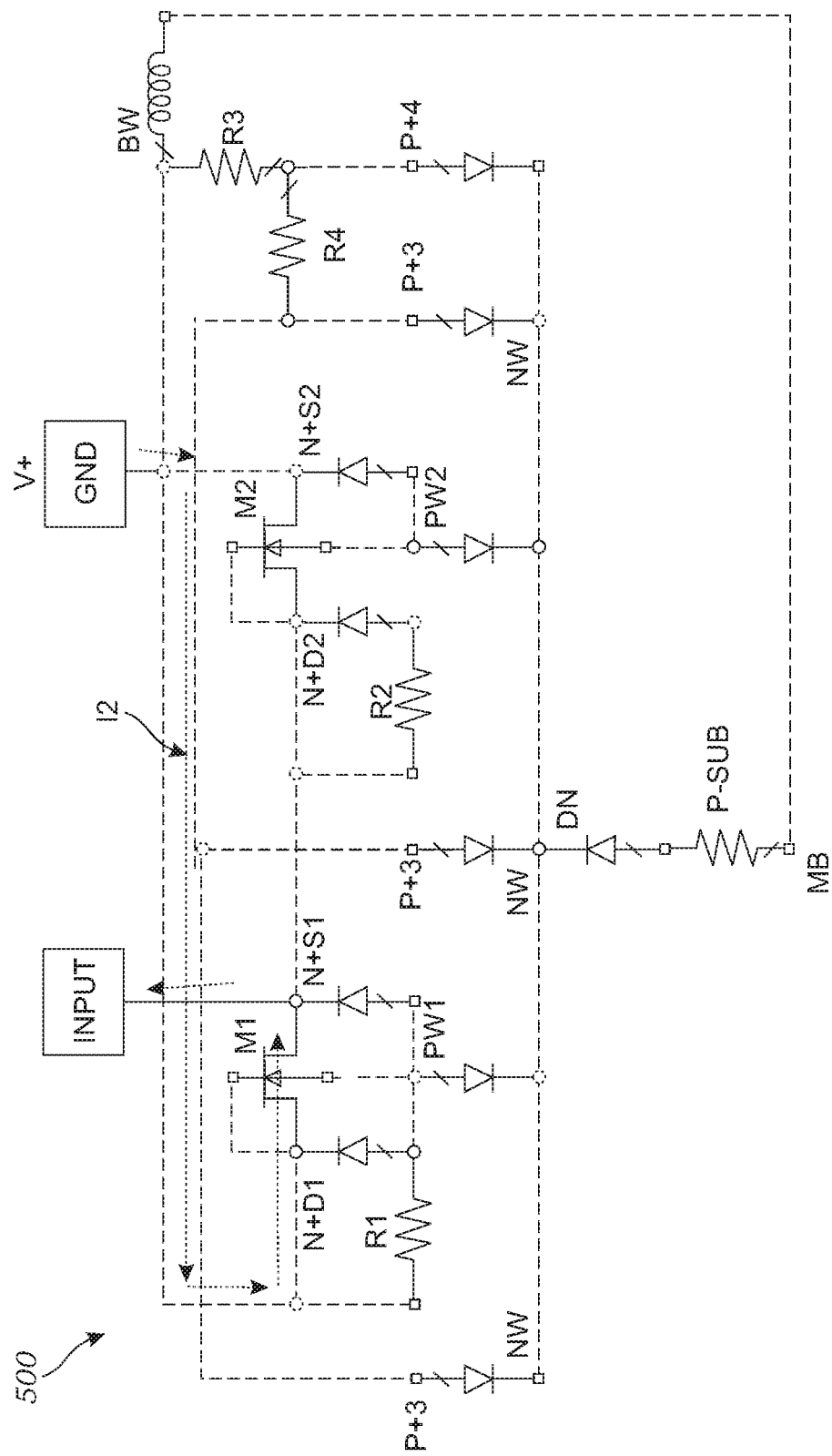
FIG. 5 is an illustration of the RF limiter circuit current paths associated with a positive voltage V+ being applied to the ground terminal of the electrical schematic diagram illustrated in FIG. 2.

FIG. 4 and FIG. 5 illustrate the RF limiter circuit current paths associated with a positive voltage V+ being applied to the input (INPUT) and ground (GND) terminals respectively of the electrical schematic diagram illustrated in FIG. 2. FIG. 4 shows the current path through circuit 400 when positive voltage V+ is applied to terminal INPUT. Current I1 enters drain N+D2 on NMOS FET M2 and exits at source N+S2 of NMOS FET M2 to reach ground terminal GND. FIG. 5 shows the current path through circuit 500 when positive voltage V+ is applied to ground terminal GND. Current I2 enters drain N+D1 on NMOS FET M1 and exits at source N+S1 of NMOS FET M1 to reach input terminal INPUT. An RF signal applied between terminals INPUT and GND may become limited by the anti-parallel diode structure when the signal exceeds a designed power level. Advantageously, the power limiting is symmetrical and therefore the positive and negative halves of an RF signal experience the same limiting action. The designed limiting power level may be determined by the choice of NMOS FET gate dimensions and the scale of the CMOS fabrication technology employed. For example, a minimum gate length transistor fabricated in a 0.18 micron CMOS technology may start limiting a power level at +14 dBm. More precise power limiting characteristics may be achieved by adjusting the transistor channel width in the range of 5 microns to 30 microns to achieve RF signal limiting performance up to 5 GHz. Additionally, the appropriate choice of resistor values for resistors R1 and R2, which may range from 1 kOhm to 100 kOhm, may result in controlling an input voltage between 0.7V and 0.5V using 0.18 micron CMOS technology transistors. Resistors R3 and R4 may have a values ranging from 1 kOhm to 100 kOhm. The purpose of resistor R3 is to prevent deep N-well DN from floating electrically and the purpose of resistor R4 is to minimize the loss of signal between INPUT and GND.

Figure 6:
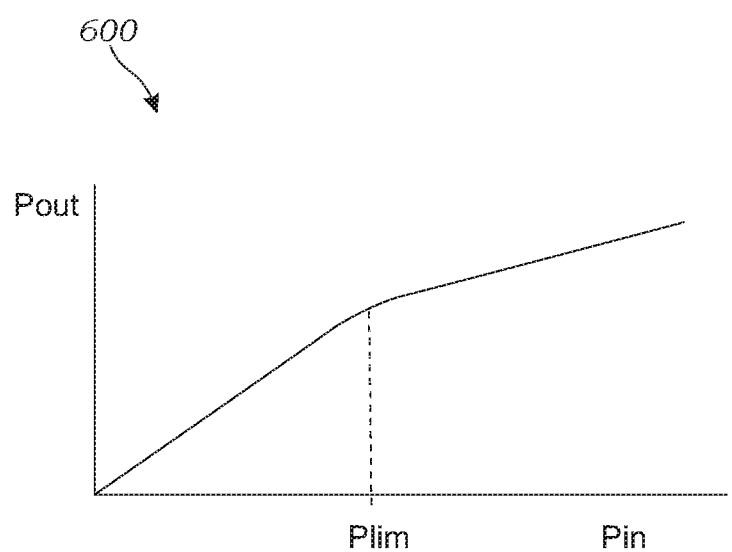
FIG. 6 is an illustration of a typical RF limiter characteristic according to an embodiment of the invention.

FIG. 6 illustrates a typical RF limiter characteristic according to an embodiment of the invention. Plot 600 shows Output RF power Pout as a function of input power Pin. At low power levels output power Pout follows input power Pin linearly at about a one to one slope. Above a certain power level denoted Plim output power Pout increases at a lower rate than input power Pin, effectively limiting Pout as Pin increases.

Figure 7:
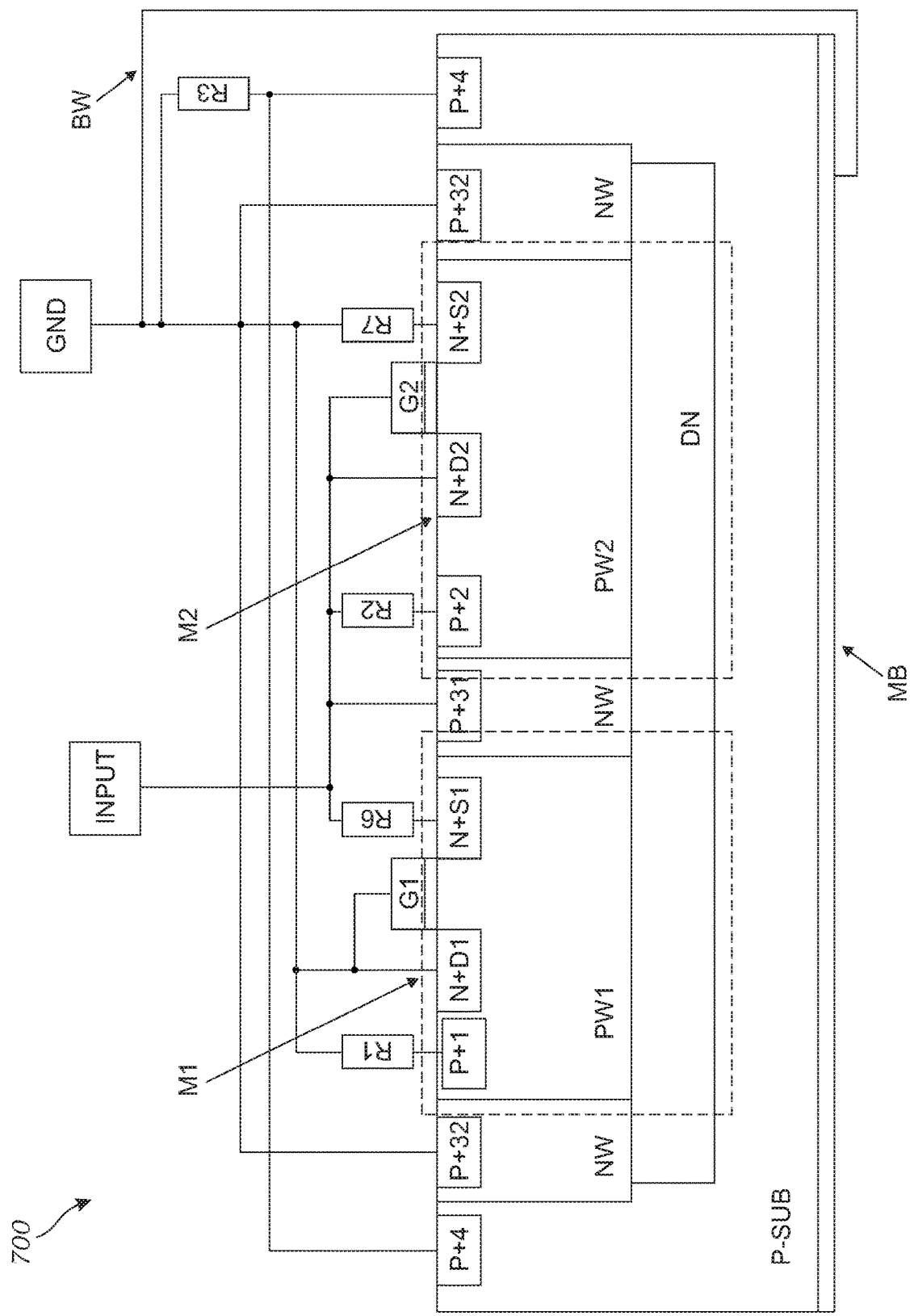
FIG. 7 is a cross section diagram of a CMOS technology implementation of an RF power limiting circuit in accordance with another embodiment of the invention.

FIG. 7 illustrates a cross section diagram of a low cost CMOS technology implementation of an RF power limiting circuit 700 in accordance with a second embodiment of the invention. The circuit is based on two NMOS FET transistors, M1 and M2, both isolated from a P-type Silicon substrate P-SUB by a deep N-well DN of a commonly known triple well CMOS process technology. The structures within the Silicon substrate are the same as shown in FIG. 1A with the exception that the P-type doped regions P+3 are now separated in the plane of the substrate surface into P-type doped regions P+31 and P+32. Additionally, the external connections are modified to enable RF power limiter circuit 700 to also perform as an ESD circuit at higher signal levels or when high voltage pulses arrive at the terminals. As illustrated in FIG. 7, terminal INPUT is connected directly to P-type doped region P+31 and coupled through resistor R6 to source region N+S1 of NMOS FET M1. Similar to FIG. 1, terminal INPUT remains connected to drain region N+D2 and gate electrode G2 of NMOS FET M2 while being coupled through resistor R2 to highly P-type doped region P+2, which forms an Ohmic contact to second P-well PW2. FIG. 7 also illustrates that terminal GND is connected directly to P-type doped regions P+32 and coupled through resistor R7 to source region N+S2 of NMOS FET M2. Similar to FIG. 1, terminal GND remains connected to drain region N+D1 and gate electrode G1 of NMOS FET M1 while being coupled through resistor R1 to highly P-type doped region P+1, which forms an Ohmic contact to second P-well PW1. Terminal GND is additionally coupled to substrate P-SUB through resistor R3 and is connected through bond wire BW to package metal backplane BM as is likewise illustrated in FIG. 1.

Figure 8:
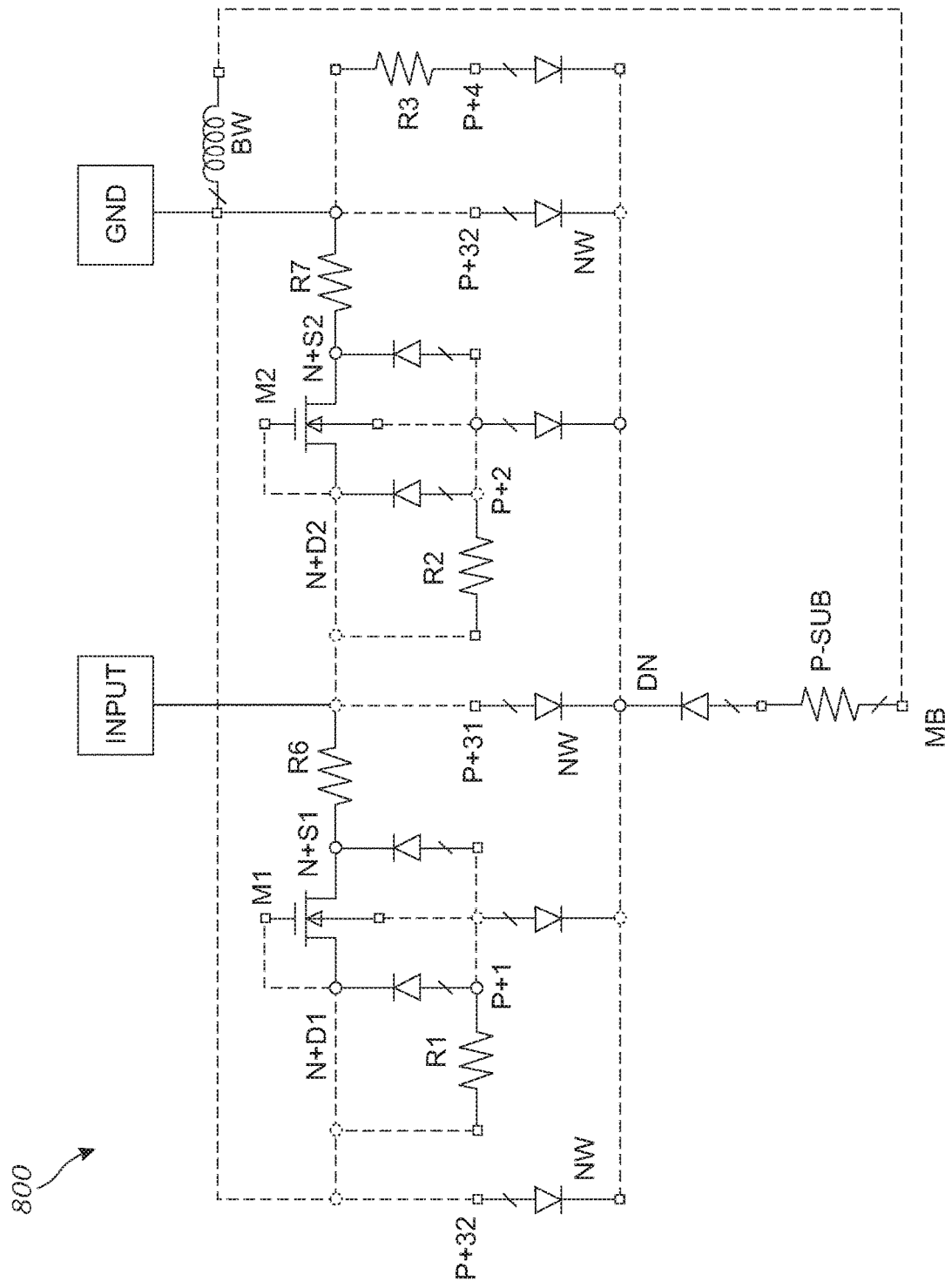
FIG. 8 is an electrical schematic diagram representing an equivalent circuit of the RF power limiter circuit structures shown in FIG. 7.

FIG. 8 illustrates an electrical schematic diagram representing an equivalent circuit 800 of the RF power limiter circuit structures shown in FIG. 7. The circuit node labels shown in FIG. 8 correspond to like named structure elements in FIG. 7. NMOS FETs M1 and M2 are shown to be in a diode-connected arrangement due to their gate electrodes and drain electrodes being tied together.

Figure 9:
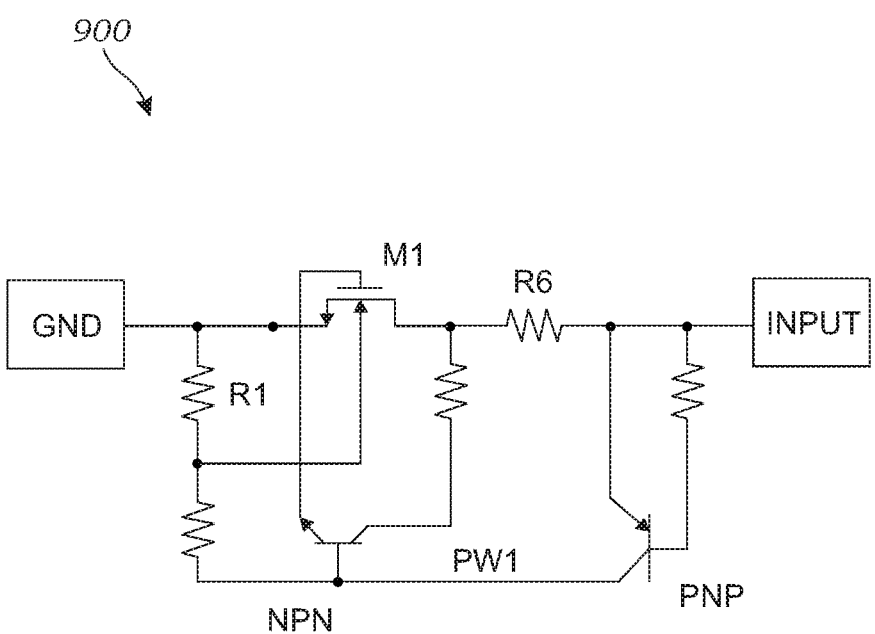
FIG. 9 is an electrical schematic diagram representing an equivalent circuit of the RF power limiter circuit portion fulfilling an ESD protection function.

The circuit illustrated in FIGS. 7 and 8 has two modes of operation comprising an RF power limiter circuit mode and an ESD protection circuit mode. For both modes the operations are symmetrical relative to applying positive and negative voltages between terminals INPUT and GND. When a fairly small RF signal is applied between terminals INPUT and GND, the current-voltage characteristic is as shown in FIG. 6, which is representative of the action of two diodes in an anti-parallel configuration similar to that shown in FIG. 1A. However, the circuit illustrated in FIG. 7, when operating in an ESD mode and responding to a fairly large applied voltage or high voltage spike reaching a trigger voltage level Vtrig, operates as shown in FIGS. 8 and 9. In ESD protection circuit mode NMOS FET M1 in the circuit illustrated in FIG. 7 resembles a grounded gate NMOS FET acting as a Silicon Controlled Rectifier (SCR) at fairly large voltages, at least above Vtrig, between terminals INPUT and GND.

FIG. 9 illustrates an electrical schematic diagram 900 of NMOS FET M1 along with parasitic Bipolar transistors PNP and NPN which participate in the SCR action through transistor M1 upon application of an applied voltage above Vtrig. P-well PW1 acts as the base of transistor NPN and the collector of transistor PNP. Resistors R1, R2 and R3 may have values as described along with their usage in FIG. 1a. Resistors R6 and R7 may be have values between 1 ohm and 50 ohm. A smaller value of resistor R6 produces a higher ESD threshold voltage. For example, a 10 ohm resistor value may set a threshold voltage between 5V to 7V for circuits fabricated in a 0.18 um CMOS fabrication technology. This corresponds to 23 dBm and 27 dBm RF power limiting level for an RF signal applied between terminal INPUT and terminal GND and in a typical 50 ohm circuit.

Figure 10:
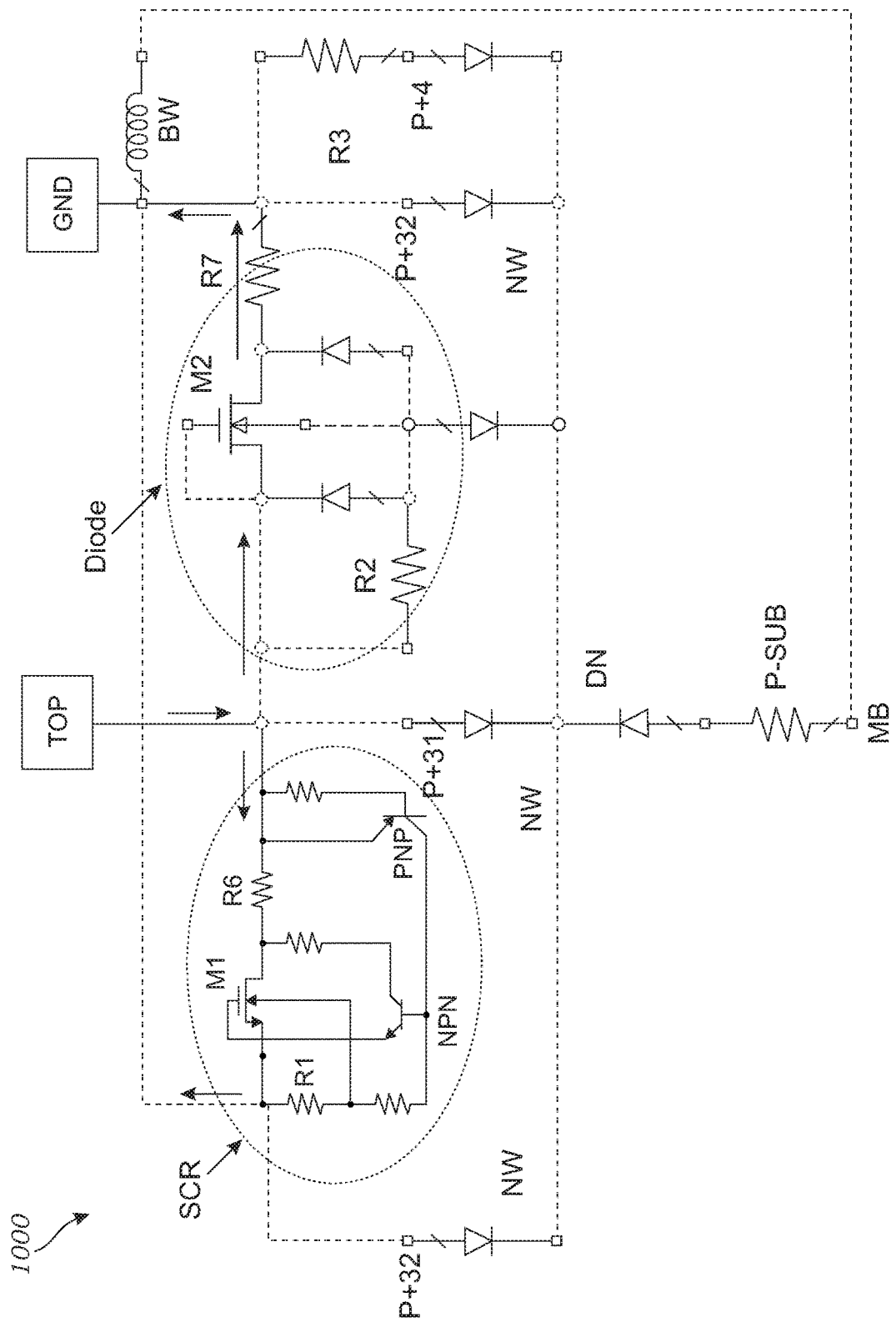
FIG. 10 is an illustration of the combined RF limiter and ESD protection circuit current paths associated with a positive voltage V+ being applied to the input terminal of the circuit of FIG. 7.

FIG. 10 illustrates an electrical schematic diagram illustrating current flow in circuit 1000 from terminal INPUT to terminal GND with an applied voltage above Vtrig. The current has two paths, one through transistor M1 operating as a SCR and another through transistor M2 acting as a diode. The two modes of the circuit, RF power limiter and ESD protection work simultaneously. The element labels in FIG. 10 are the same as in FIGS. 8 and 9.

Figure 11:
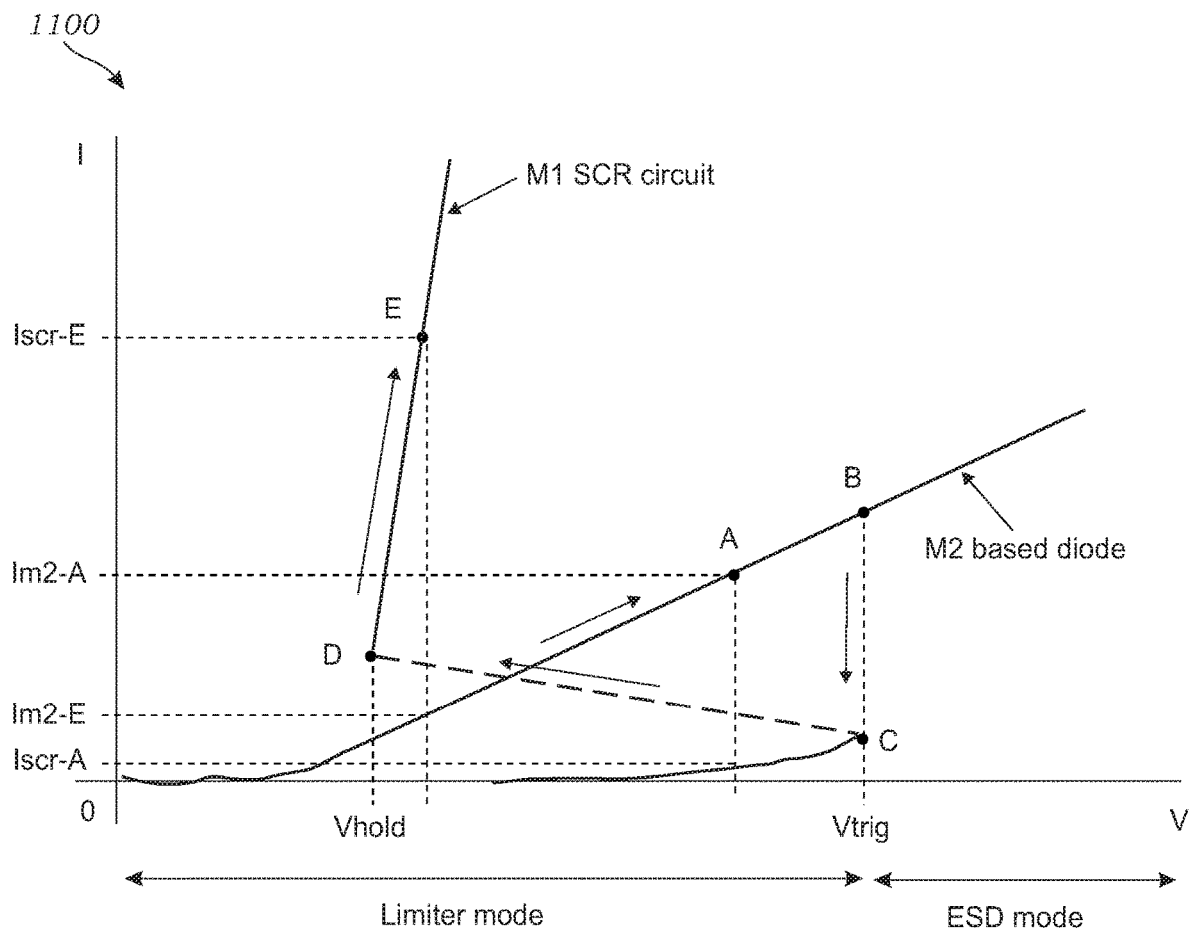
FIG. 11 is an IV characteristic curve depicting the dual mode operation of the circuits illustrated in FIG. 10.

FIG. 11 illustrates an IV characteristic curve depicting the dual mode operation of the circuits illustrated in FIG. 10. FIG. 11 illustrates an IV characteristics plot 1100 of transistors M1 and M2 as they operate simultaneously in a SCR mode and diode mode respectively during an increase of signal voltage on terminal INPUT. IV curve 1100 of FIG. 11 shows along the voltage axis a Limiter mode from zero to trigger voltage Vtrig and then an ESD mode above Vtrig. Key points A, B, C, D and E describe plot 1100's important operating points. Point A is the voltage at which transistor M2 passes current Lm2-A and begins to limit an input RF signal, for example at the point Plim shown on plot 1200 of FIG. 12. When transistor M2 is at point A transistor M1 passes current Iscr-A which is below its SCR trigger voltage Vtrig. Points B and C are the trigger voltage Vtrig at which point the ESD operation begins on transistor M1 and the SCR mode of transistor M1 turns on and the voltage and current move to point D where the voltage is held at Vhold. Small increases in voltage then result in large increases in current through transistor M1 to point E and current Iscr-E. The current in transistor M2 when transistor M1 is at point E is Im2-E which represents the continuing power limiting operation even during an ESD protection action.

Figure 12:
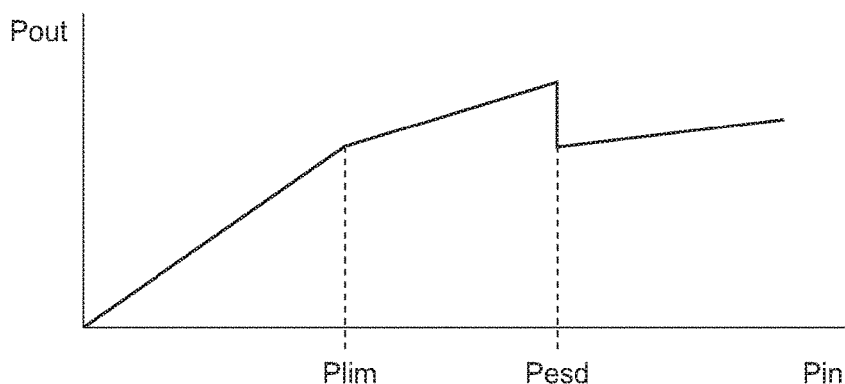
FIG. 12 illustrates the RF power in (Pin) vs Power out (Pout) characteristic for the circuits illustrated in FIG. 10.

FIG. 12 illustrates the RF power in (Pin) vs Power out (Pout) characteristic 1200 for the circuits illustrated in FIG. 10. At low power levels output power Pout linearly follows input power Pin.

Above a certain power level Plim output power Pout increases at a lower rate than input power Pin due to the anti-parallel diodes based on M1 and M2 limiting output signal power. When the input power level reaches Pesd the SCR circuits based on M1 and M2 start limiting the output power and the output power increases at an even lower rate than in the preceding region.

Reference throughout this specification to "one embodiment," "an embodiment," "one example," or "an example" means that a particular feature, structure, or characteristic described in connection with the embodiment or example is included in at least one embodiment or example of the present invention. Thus, the appearances of the phrases such as "in one embodiment" or "in one example" in various places throughout this specification are not necessarily all referring to the same embodiment or example. Furthermore, the particular features, structures, or characteristics may be combined in any suitable manner in one or more embodiments or examples. Directional terminology such as "top", "down", "above", "below" are used with reference to the orientation of the figure(s) being described. Also, the terms "have," "include," "contain," and similar terms are defined to mean "comprising" unless specifically stated otherwise. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

The above description of illustrated examples of the present invention, including what is described in the Abstract, are not intended to be exhaustive or to be limited to the precise forms disclosed. While specific embodiments of, and examples for, the invention are described herein for illustrative purposes, various equivalent modifications are possible without departing from the broader spirit and scope of the present invention. Indeed, it is appreciated that the specific example structures and materials are provided for explanation purposes and that other structures and materials may also be employed in other embodiments and examples in accordance with the teachings of the present invention. These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation.

What is claimed is:

1. A radio frequency (RF) power limiter circuit for limiting the power of a symmetrical RF input signal, the circuit amenable for fabrication in a CMOS technology, the RF power limiter circuit comprising:
   a P-type Silicon substrate with first and second planar P-well regions formed on a front surface of the substrate wherein each P-well region is surrounded by an N-well region and a deep N-well spans the region beneath the P-well and the N-well regions;
   an input terminal and a ground terminal both affixed to the front surface of the substrate;
   a first NMOS field effect transistor (FET) formed in the first P-well region and a second NMOS FET formed in the second P-well region, wherein the two NMOS FETs are each configured to perform a diode function with a defined forward voltage and are arranged in an anti-parallel configuration and coupled between the input terminal and the ground terminal;
   a first resistor connected between the ground terminal and an Ohmic contact to the first P-well and a second resistor connected between the input terminal and an Ohmic contact to the second P-well;

a first shunt wire connecting the ground terminal and the gate electrode and the drain terminal of the first NMOS FET and a second shunt wire connecting the input terminal and the gate electrode and the drain terminal of the second NMOS FET;

a third shunt wire connecting the ground terminal to the source terminal of the second NMOS FET and a fourth shunt wire connecting the input terminal to the source terminal of the first NMOS FET, wherein an RF signal applied symmetrically to the input terminal and ground terminal becomes symmetrically attenuated when the signal level exceeds the defined forward voltage of the diode configured NMOS FETs.

2. The RF power limiter circuit of claim 1, further comprising:

a bond wire connecting the ground terminal to a back surface of the P-type Silicon substrate wherein the bond wire contributes an inductance to the power limiter circuit design;

a third resistor connected between the ground terminal and an Ohmic contact to the P-type Silicon substrate; and a fourth resistor connected between the Ohmic contact to the P-type Silicon substrate and one or more P+ doped contact regions formed in the N-well regions, whereby the deep N-well is diode isolated from the P-wells, the P-type Silicon substrate, the ground terminal and the input terminal.

3. The RF power limiter circuit of claim 2, wherein the P-type Silicon substrate has a thickness that is between 3 um and 200 um, and wherein a back side of the P-type Silicon substrate is in electrical contact with a metallized integrated circuit package surface.

4. The RF power limiter circuit of claim 2, wherein the NMOS FETs are fabricated in 0.18 um CMOS fabrication technology and provide a power limiting level starting at +14 dBm.

5. The RF power limiter circuit of claim 4, wherein the NMOS FETs are fabricated with gate electrode widths between 5 um and 30 um in order to determine a power limiting level for RF signals as fast as 5 GHz.

6. The RF power limiter circuit of claim 4, wherein the first and second resistors have values between 1 kOhm and 100 kOhm.

7. The RF power limiter circuit of claim 4, wherein the fourth resistor has values between 1 kOhm and 100 kOhm, and wherein the fourth resistor prevents the deep N-well from floating.

8. The RF power limiter circuit of claim 4, wherein the third resistor has values between 1 kOhm and 100 kOhm, and wherein the third resistor reduces losses of the RF signal applied between the input terminal and the ground terminal.

9. The RF power limiter circuit of claim 2, wherein the P well and N well regions are formed within a P-type epitaxial Silicon layer grown over a P-type Silicon substrate, the deep N well region having been formed in the substrate prior to the epitaxial Silicon layer growth.

10. The RF power limiter circuit of claim 1, wherein the power limiter circuit is integrated into an RF transceiver circuit comprising the power limiter circuit and a low noise amplifier fabricated on the same Silicon substrate.

11. The RF power limiter circuit of claim 1, further comprising:

a bond wire connecting the ground terminal to a back surface of the P-type Silicon substrate, wherein the bond wire contributes an inductance to the power limiter circuit design;

a third resistor connected between the ground terminal and an Ohmic contact to the P-type Silicon substrate; and one or more P+ doped contact regions formed in the N-well regions connected to a regulated positive voltage power supply.

12. A radio frequency (RF) power limiter circuit and ESD protection circuit for limiting the power of a symmetrical RF input signal and protecting against voltage spikes, the circuit amenable for fabrication in a CMOS technology, the RF power limiter circuit and ESD protection circuit comprising:

a P-type Silicon substrate with a first and second planar P-well regions formed on a front surface of the substrate wherein each P-well region is surrounded by an N-well region and a deep N-well spans the region beneath the P-well and the N-well regions;

an input terminal and a ground terminal both affixed to the front surface of the substrate;

a first NMOS field effect transistor (FET) formed in the first P-well region and a second NMOS FET formed in the second P-well region, wherein the two NMOS FETs are each configured to perform a diode function with a defined forward voltage and are arranged in an antiparallel configuration and coupled between the input terminal and the ground terminal;

a first resistor connected between the ground terminal and an Ohmic contact to the first P-well and a second resistor connected between the input terminal and an Ohmic contact to the second P-well;

a first shunt wire connecting the ground terminal and the gate electrode and the drain terminal of the first NMOS FET and a second shunt wire connecting the input terminal and the gate electrode and the drain terminal of the second NMOS FET;

a third resistor connecting the ground terminal to the source terminal of the second NMOS FET and a fourth resistor connecting the input terminal to the source terminal of the first NMOS FET; and a third shunt wire connecting the ground terminal to one or more P+ doped contact regions formed in the N-well regions and a fourth shunt wire connecting the input terminal to different P+ doped contact region formed in the N-well regions, wherein an RF signal applied symmetrically to the input terminal and ground terminal becomes symmetrically attenuated when the signal level exceeds the defined forward voltage of the diode configured NMOS FETs and wherein an ESD signal in excess of a designed value is attenuated by action of a grounded gate NMOS FET.

13. The RF power limiter circuit and ESD protection circuit of claim 12, further comprising:

a bond wire connecting the ground terminal to a back surface of the P-type Silicon substrate wherein the bond wire contributes an inductance to the power limiter circuit design; and a fifth resistor connected between the ground terminal and an Ohmic contact to the P-type Silicon substrate.

14. The RF power limiter circuit and ESD protection circuit of claim 13, wherein the P-type Silicon substrate has thickness between 3 um and 200 um, and the back side of the P-type Silicon substrate is in electrical contact with a metallized integrated circuit package surface.

15. The RF power limiter circuit and ESD protection circuit of claim 12, wherein the NMOS FETs are fabricated in 0.18 um CMOS fabrication technology and provide a power limiting level starting at +14 dBm.

16. The RF power limiter circuit and ESD protection circuit of claim 14, wherein the NMOS FETs are fabricated with gate electrode widths between 5 um and 30 um in order to determine a power limiting level for RF signals as fast as 5 GHz.

17. The RF power limiter circuit and ESD protection circuit of claim 14, wherein the first and second resistors may have values between 1 kOhm and 100 kOhm.

18. The RF power limiter circuit and ESD protection circuit of claim 14, wherein the fourth resistor may have values between 1 kOhm and 100 kOhm wherein the fourth resistor prevents the deep N-well from floating.

19. The RF power limiter circuit and ESD protection circuit of claim 14, wherein the third resistor may have values between 1 kOhm and 100 kOhm wherein the third resistor reduces losses of the RF signal applied between the input terminal and the ground terminal.

20. The RF power limiter circuit and ESD protection circuit of claim 13, wherein the P well and N well regions are formed within a P-type epitaxial Silicon layer grown over a P-type Silicon substrate, the deep N well region having been formed in the substrate prior to the epitaxial Silicon layer growth.

\* \* \* \* \*